US009003251B2

(12) United States Patent
Prakash (10) Patent No.: US 9,003,251 B2
(45) Date of Patent: Apr. 7, 2015

(54) DIAGNOSIS FLOW FOR READ-ONLY MEMORIES

(75) Inventor: Suraj Prakash, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 313 days.

(21) Appl. No.: 12/767,948

(22) Filed: Apr. 27, 2010

(65) Prior Publication Data

US 2011/0231716 A1    Sep. 22, 2011

(30) Foreign Application Priority Data

Mar. 16, 2010  (IN) .......................... 0606/DEL/2010

(51) Int. Cl.
*G01R 31/28* (2006.01)
*G11C 29/12* (2006.01)
*G11C 29/42* (2006.01)
*G11C 17/00* (2006.01)

(52) U.S. Cl.
CPC ................ *G11C 29/12* (2013.01); *G11C 29/42* (2013.01); *G11C 17/00* (2013.01)

(58) Field of Classification Search
CPC ......... G11C 17/00; G11C 29/42; G11C 29/12
See application file for complete search history.

(56) References Cited

U.S. PATENT DOCUMENTS

| | | | |
|---|---|---|---|
| 5,617,531 A * | 4/1997 | Crouch et al. ................... 714/30 |
| 6,006,345 A * | 12/1999 | Berry, Jr. ........................ 714/718 |
| 6,169,695 B1 * | 1/2001 | Duesman ........................ 365/201 |
| 6,404,250 B1 | 6/2002 | Volrath et al. |
| 6,571,364 B1 * | 5/2003 | Maeno et al. ................... 714/736 |
| 6,950,971 B2 | 9/2005 | Boehler et al. |
| 7,319,623 B1 * | 1/2008 | Yuan et al. ...................... 365/201 |
| 7,370,251 B2 * | 5/2008 | Nadeau-Dostie et al. ..... 714/723 |
| 8,225,151 B2 * | 7/2012 | Rajeev et al. ................... 714/719 |
| 2001/0022752 A1 * | 9/2001 | Duesman ........................ 365/201 |
| 2001/0052093 A1 * | 12/2001 | Oshima et al. ................. 714/719 |
| 2002/0194558 A1 * | 12/2002 | Wang et al. ..................... 714/718 |
| 2004/0193984 A1 * | 9/2004 | Soundron ....................... 714/733 |
| 2006/0028891 A1 | 2/2006 | Selva et al. |
| 2006/0069966 A1 * | 3/2006 | Liu ................................. 714/718 |
| 2009/0254788 A1 * | 10/2009 | Cervantes et al. ............. 714/733 |
| 2009/0327824 A1 * | 12/2009 | Alaniz et al. ................... 714/732 |

OTHER PUBLICATIONS

Andrew B. Kahng, Sherief Reda, Combinatorial Group Testing Methods for the BIST Diagnosis Problem, 2004.*
Niggemeyer, D., et al., "Diagnostic Testing of Embedded Memories Based on Output Tracing", IEEE Xplore, 2000, pp. 113-118.

(Continued)

*Primary Examiner* — Guerrier Merant
(74) *Attorney, Agent, or Firm* — Allen, Dyer, Doppelt, Milbrath & Gilchrist, P.A.

(57) ABSTRACT

A system and a method for diagnosis flow for a read-only memory (ROM) includes determining whether a window of the ROM is faulty, based on a pre-computed signature and a computed signature corresponding to the window. Based on the determination, the size of the window is reduced to form at least two reduced windows. It is further ascertained whether the at least two reduced windows are faulty based on pre-computed signatures corresponding to the at least two reduced windows and computed signatures corresponding to the at least two reduced windows.

22 Claims, 8 Drawing Sheets

(56) References Cited

OTHER PUBLICATIONS

Chen, J.T., et al, "Test Response Compression and Bitmap Encoding for Embedded Memories in Manufacturing Process Monitoring", ITC International Test Conference, 2001, pp. 258-267.

Mukherjee, N., et al., "High Throughput Diagnosis via Compression of Failure Data in Embedded Memory BIST", International Test Conference IEEE, 2008, pp. 1-10.

Huang, R., et al. "A Memory Built-in Self-Diagnosis Design with Syndrome Compression", IEEE International Workshop on Defect Based Testing, 2004, pp. 99/104.

Kahng et al., "Combinatorial Group Testing Methods for the BIST Diagnosis Problem," IEEE, 2004, pp. 113-116.

* cited by examiner

DIAGNOSIS FLOW FOR READ-ONLY MEMORIES

RELATED APPLICATION

The present application claims priority of India Patent Application No. 0606/DEL/2010 filed Mar. 16, 2010, which is incorporated herein in its entirety by this references.

FIELD OF THE INVENTION

The present invention relates to diagnosis flow for faults present in read-only memory (ROM).

BACKGROUND

With the recent advancements in very-large-scale integration (VLSI) technology, the complexity of various integrated circuits (ICs) has increased. Today, ICs include numerous functional modules like processor, memory, timers, counters, voltage regulators, etc. The various functional modules may be integrated on a single IC to enable the IC to operate as a standalone system, referred to as a system-on-chip (SOC).

Memory, in particular, forms the largest part of an SOC. A typical memory includes a number of transistors. In the recent past, the size of transistors used in memories has decreased. The transistors are therefore densely packed in the SOC to increase its functionality. However, due to such a dense integration, the transistors and, in turn, the memories become susceptible to functional stress, environmental stress, and fabrication faults.

In memories, for example, read-only memories (ROMs), various types of faults, such as stuck-at faults, word line coupling faults, bit line coupling faults, and delay decoder faults, occur. Occurrence of any such fault may cause failure of a functionality of the SOC or of the SOC itself. Thus, the testing and diagnosis of memory failures becomes important.

Testing and diagnosis of a faulty memory help in identifying the exact location of defect(s) in the memory. In the memories, testing and diagnosis can be done either externally or internally. External testing offers limited control for embedded memories. For testing the faults internally, methods such as Built-in Self Test (BIST) are implemented as test circuits fabricated along with the memory.

The test circuit generates test patterns and reads the contents of the memory in order to test and diagnose the faults present in the memory. Upon determining a fault, the BIST circuit outputs contents of the memory to a tester for further diagnosis and correction. Such testers have a limited memory and data transfer speed, thus increasing time taken for debugging the memory contents.

SUMMARY

This summary is provided to introduce concepts related to diagnosis flow for faults present in a ROM, which are further described below in the detailed description. This summary is not intended to essential features of the claimed subject matter nor is it intended for use in determining or limiting the scope of the claimed subject matter.

In one embodiment, a method for identifying faults present in a window of a ROM is described. The method determines whether the window is faulty based on comparing a pre-computed signature corresponding to the window with a computed signature corresponding to the window. The pre-computed signature and the computed signature are based on an addressing mode of the ROM. Based on the determination, the window is reduced into at least two reduced windows. The method further ascertains whether the at least two reduced windows are faulty based on pre-computed signatures and computed signatures of the at least two reduced windows.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components. For simplicity and clarity of illustration, elements in the figures are not necessarily to scale.

DETAILED DESCRIPTION OF PREFERRED EMBODIMENTS

The disclosed subject matter relates to diagnosis and testing of a ROM. Particularly, the subject matter relates to a diagnosis and testing based on signature-based successive reduction diagnosis flow for a ROM.

Presently, all components, such as memory, processor, ADCs, and DACs, of electronic devices are fabricated together on a single SOC. Memories on the electronics devices, such as computers, laptops, mobile phones, and set-top boxes, include a plurality of transistors that are densely packed in the SOC. Memories also achieve a very high level of integration. Such memories may suffer from fabrication defects and a high level of functional and environmental stress, for example stuck-at faults, word line coupling faults, bit line coupling faults, delay decoder faults, etc. Therefore, testing and diagnostic methods are designed to identify faults and their exact position in a memory embedded in a SOC.

In case of read/write memories, a Built-In Self Test (BIST) generates test patterns and determines faults present in an embedded memory by first writing the test patterns on the memory and then reading the written test patterns. The faults can be identified by the difference between the written test patterns and the read test patterns. However for read-only memories, the ability to provide a write pattern that can be then read out for test purposes is not possible.

Conventionally, signature based BIST circuits are fabricated in the SOC for testing and diagnosis purposes of an embedded ROM. In such testing and diagnosis methods, a golden signature or a pre-computed signature of the embedded ROM is pre-computed and stored within the ROM itself. The computation of the golden signature is based on contents or values that are intended to be stored in the embedded ROM having no faults.

For testing and diagnosis, the contents of the embedded ROM, except the golden signature, are read to compute a signature that is compared with the golden signature. The computed signature matches the golden signature in case the embedded ROM is faultless. On the other hand, differences between the golden signature and the computed signature indicate one or more faults in the embedded ROM. In case a fault is detected, all the contents of the embedded ROM are transferred to a tester for further diagnosis and fault correction.

It would be noted that with an increase in complexity of the SOC, the amount of data to be stored in a ROM has also increased tremendously. Furthermore, the tester has a limited memory and speed for diagnosing the faults present in the embedded ROM. Thus, the output of all the contents of an embedded ROM leads to slow identification of faults.

To this end, systems and methods for diagnosing faults present in an embedded ROM are described. In an implementation, a golden signature corresponding to a window of an embedded ROM is received, as opposed to being stored in the embedded ROM itself. The window may correspond to the whole address range or to a portion of the address range of an embedded ROM. The golden signature is based on contents to be stored on the window of the ROM. Once the golden signature is received, a second signature based on contents present within the window is computed. The computed signature is then compared with the golden signature.

In a faultless window, the golden signature matches the computed signature. However, a mismatch between the golden signature and the computed signature indicates that the window or a portion of the ROM within the window is faulty. In case there is a fault, the size of the window is reduced and the window is divided into at least two reduced windows. The window is so divided that at least one of the reduced windows will include the portion of the ROM that is faulty. Subsequently, golden signatures corresponding to the reduced windows are received and signatures corresponding to the reduced windows are computed.

The golden signatures for the reduced windows are compared with the corresponding computed signatures. A match of a golden signature for a reduced window and a computed signature corresponding to that reduced window indicates that the reduced window is faultless. A mismatch, on the other hand, indicates the presence of a fault. In that case, a further reduction in size of the faulty reduced window may be performed for localizing a faulty portion. This successive reduction of the size of window can be repeated for a pre-defined number of times or till all such faulty portions of the ROM are identified. The window reduction can be based on different fault types. The address range and the contents corresponding to a faulty window can then be outputted to a tester for further diagnosis.

The tests for the embedded ROM can be implemented for different addressing modes, for example, a row mode, a column mode, a row decoder window mode, a column decoder mode, etc. Further, the tests can capture a plurality of faults, such as stuck-at faults, word line coupling faults, bit line coupling faults and delay faults of address decoder. Following the capture of faults, address range and the contents of the faulty windows, corresponding to the different modes, can be outputted to a tester. In this manner, the amount of data passed on to the tester for further diagnosis is considerably reduced, thereby improving the test response of the tester.

In another implementation, a simplified successive reduction diagnosis method is described. In this case, the test targets the stuck-at faults and the delay decoder faults only.

EXEMPLARY SYSTEMS

Figure 1:
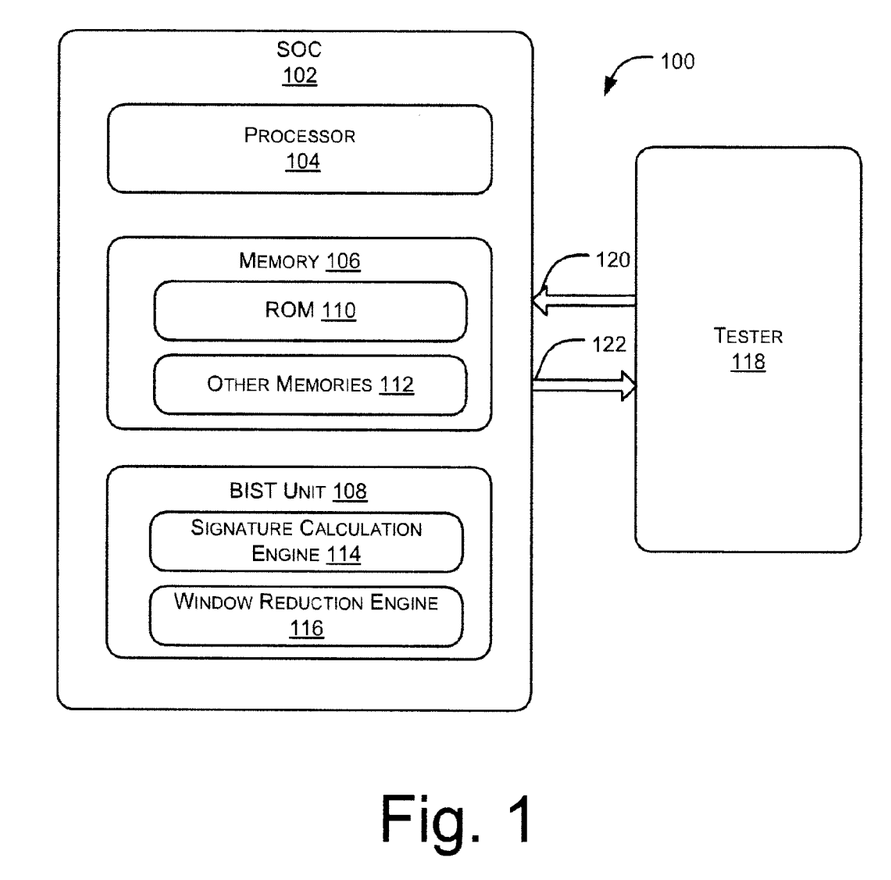
FIG. 1 illustrates an exemplary system for diagnosis flow for a ROM, in accordance with an embodiment of the present subject matter.

FIG. 1 illustrates an exemplary system 100 for signature based successive reduction diagnosis flow for testing a read-only memory (ROM) in a Built-In Self Test (BIST) environment. The system 100 includes a system-on-a-chip (SOC) 102. The SOC 102 includes all functional elements of an electronic device in which the SOC 102 is to be implemented, on a single IC. The SOC 102 may be implemented in various electronic devices, for example a computer, a mobile phone, a set-top box, a laptop, etc.

In an embodiment, the SOC 102 includes a processor 104, a memory 106, and Built-In Self Test (BIST) unit 108. The processor 104 can be a single processing unit or a combination of such units. The processor 104 may be implemented as one or more microprocessors, microcomputers, microcontrollers, digital signal processors, central processing units, state machines, logic circuitries, and/or any devices that manipulate signals based on operational instructions. Among other capabilities, the processor 104 is configured to fetch and execute computer-readable instructions stored in the memory 106.

The memory 106 includes a read-only memory (ROM) 110, on which testing is performed, and other memories 112. The ROM 110 may store program code or fixed data, for example a look-up table, a dictionary, etc., which may be required for the functioning of the SOC 102. The other memories 112 include any other memories that may be present on the SOC 102. Examples of the other memories 112 may include, but are not limited to volatile or non-volatile memories, such as SRAMs, DRAMs, SDRAMs, EEPROMs, flash drives, etc.

The BIST unit 108 is configured to test the ROM 110 to identify one or more faults, such as stuck-at faults, coupling faults, and delay decoder faults, in the ROM 110. For the purpose, the BIST unit 108 includes a signature calculation engine 114 and a window reduction engine 116. The signature calculation engine 114 computes a signature for a window of the ROM 110. The window may correspond to the whole address range or to a portion of the address range of the ROM 110.

The window can be specified by the window reduction engine 116. In one implementation, the window reduction engine 116 reduces the size of the window based on an addressing mode. The addressing mode may include a row mode, a column mode, a row decoder mode, and a column decoder mode. In another implementation, the signature calculation engine 114 may include a multiple input shift register (MISR) to receive contents of the window and compute the signature corresponding to the window.

In operation, the BIST unit 108 receives a golden signature corresponding to the window in the ROM 110. The golden signature represents the expected signature that would be obtained if the window was faultless. In an implementation, the BIST unit 108 receives a signal corresponding to the addressing mode along with the golden signature. The addressing mode can be specified, for example, by a two bit signal which can indicate four different addressing modes. In one implementation, the BIST unit 108 receives the golden signature from a tester 118 coupled to the SOC 102. In another implementation, the golden signature is shifted in from the tester 118. The BIST unit 108 may receive the golden signature through an input bus 120.

On receiving the golden signature, the signature calculation engine 114 of the BIST unit 108 computes the signature based on the contents received by the signature calculation engine 114. The BIST unit 108 compares the golden signature with the computed signature. Upon determining a match, i.e., in cases where the window is found to be faultless, the BIST unit 108 transfers a pass signal to the tester 118 over an output bus 122. On the other hand, upon determining a mismatch, the window reduction engine 116 of the BIST unit 108 successively reduces the size of the window by dividing the window into at least two reduced windows.

In one implementation, the BIST unit 108 reduces the size by dividing the window into a plurality of reduced sized windows. Once divided, the signature calculation engine 114 computes signatures for the reduced windows based on the respective contents of the reduced windows. The BIST unit 108 compares the computed signatures for each of the reduced windows with their corresponding golden signatures. The golden signature for the reduced windows is obtained based on the contents that have would have been present within the reduced windows of the embedded ROM.

The BIST unit 108 ignores those reduced windows where the computed signature matches the golden signature. For the reduced windows where the golden and the computed signature fails to match, the BIST unit 108 transfers the contents of those windows to the tester 118 through the output bus 122. In an implementation, the window reduction engine 116 of the BIST unit 108 may further reduce the size of the windows before outputting the contents to the tester 118. These and other aspects are explained in detail with reference to FIG. 2.

Figure 2:
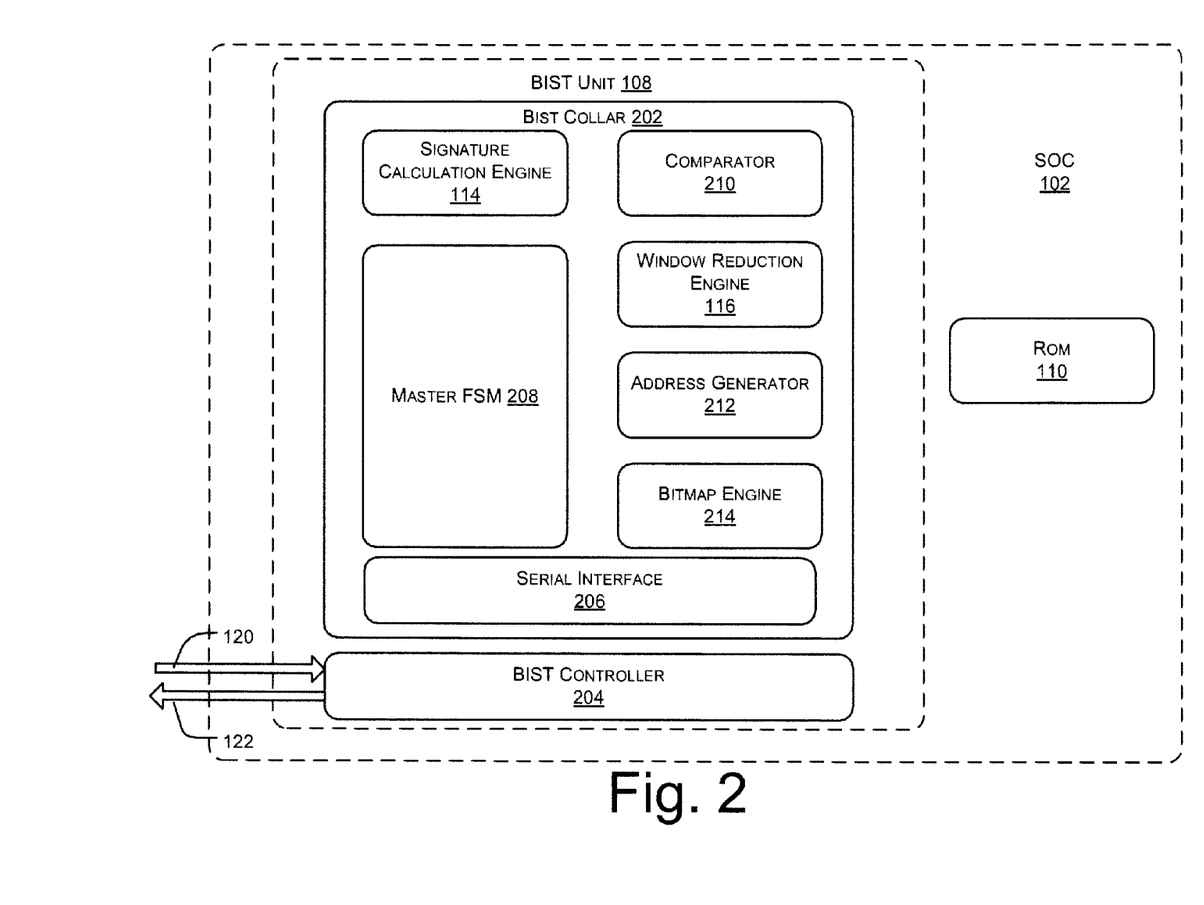
FIG. 2 illustrates an exemplary configuration of a Built-in Self Test (BIST), in accordance with an embodiment of the present subject matter.

FIG. 2 illustrates the BIST unit 108 configured to test the ROM 110, in accordance with an embodiment of the present subject matter. In said embodiment, the BIST unit 108 includes a BIST collar 202 and a BIST controller 204. The BIST controller 204 receives a golden signature corresponding to a window of the ROM 110 from the tester 118 (not shown in FIG. 2). The BIST controller 204 sends control signals, such as an addressing mode signal, and a reduction iteration signal, and the golden signature to the BIST collar 202 for testing the ROM 110.

In one embodiment, the BIST collar 202 further transfers an address range and corresponding contents of all faulty windows in the ROM 110 to the BIST controller 204. The BIST controller 204, in turn, shifts out or outputs the address range and the corresponding contents of the faulty windows to the tester 118. The faulty windows may correspond to the whole address range or a portion of the address range of the ROM 110.

In another embodiment, the BIST controller 204 exchanges signals, such as the control signals, the golden signature, and the address ranges of the faulty windows along with their contents, with the BIST collar 202 through a serial interface 206. The BIST controller 204 receives the golden signature from the tester 118 through the input bus 120 and transfers the address ranges of the faulty windows along with their contents to the tester 118 through the output bus 122.

The BIST collar 202 may further include a master finite state machine (FSM) 208, a comparator 210, the signature calculation engine 114, the window reduction engine 116, an address generator 212, and a bitmap engine 214 for testing of faults present in the ROM 110. Among other things, the master FSM 208 receives the control signals to generate signals corresponding to various addressing modes, such as row fast, row decrement, column fast, column decrement, row decoder, and column decoder, that can to be performed on every window of the ROM 110.

Figure 3:
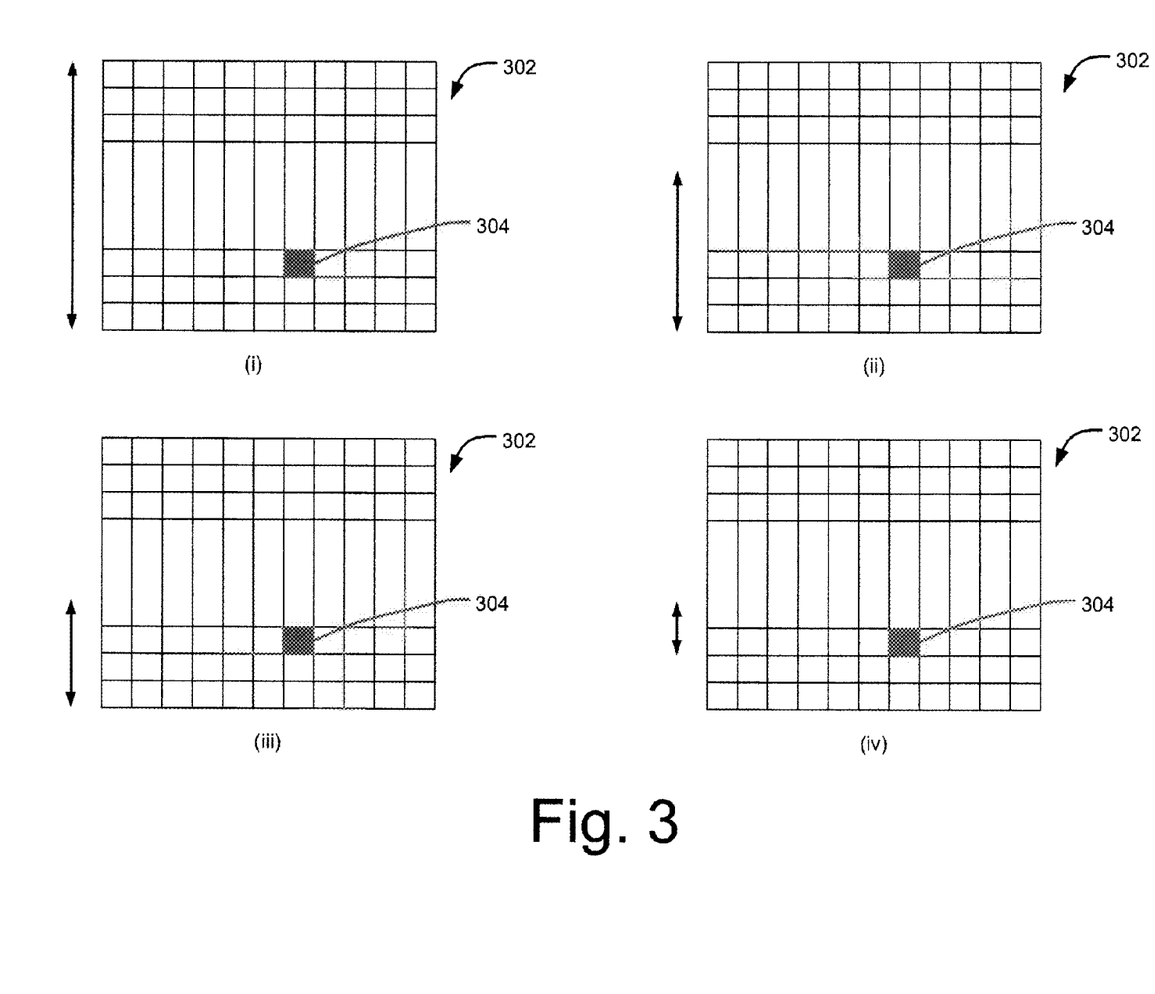
FIG. 3 illustrates successive reduction diagnosis flow for a faulty row window, in accordance with an embodiment of the present subject matter.
Figure 4:
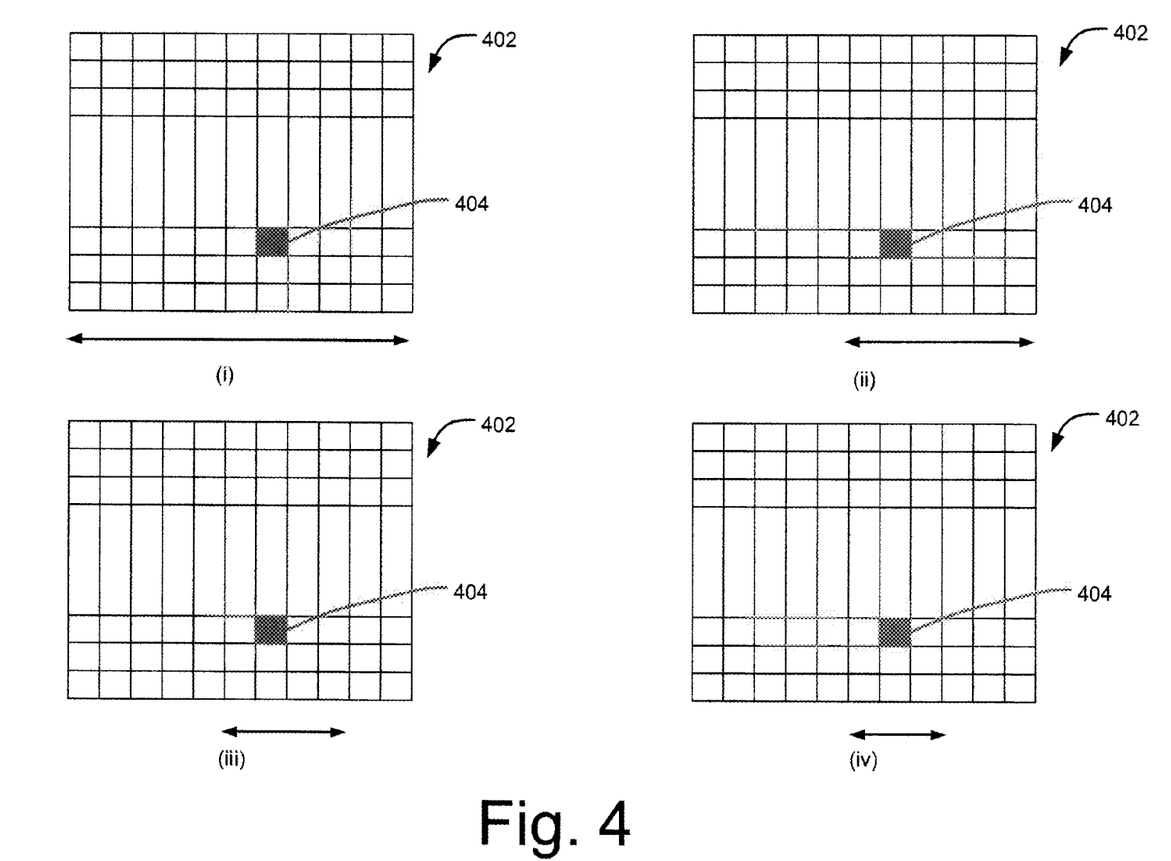
FIG. 4 illustrates successive reduction diagnosis flow for a faulty column window, in accordance with an embodiment of the present subject matter

The working of the BIST unit 108 and its components may be better understood in conjunction with FIGS. 3 to 5. In operation, the signature calculation engine 114 receives an indication from the master FSM 208 to read contents of a window from the ROM 110. As an initial state, the window may correspond to the whole address range of the ROM 110. The window may also correspond to an address range as specified by the master FSM 208. The signature calculation engine 114 computes a signature corresponding to the contents read from the ROM 110.

Figures 5A, 5B:
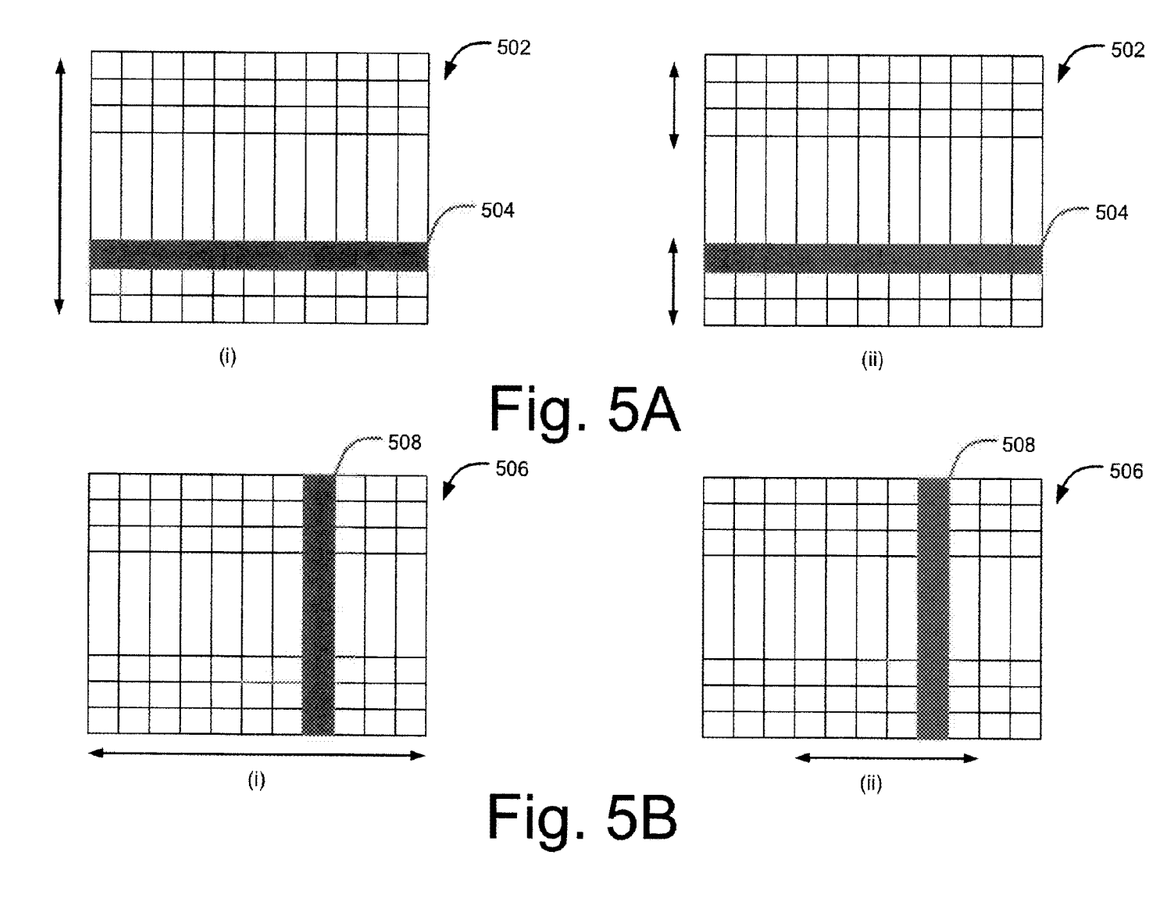
FIG. 5 illustrates successive reduction diagnosis flow for a faulty row decoder window and a faulty column decoder window, in accordance with an embodiment of the present subject matter.

In one implementation, in a row window reduction, as illustrated in FIG. 3, memory addresses being read are subsequently increased by a mux value of memory. FIG. 4 illustrates a column window reduction, while FIG. 5 illustrates fault detection in the row decoder and the column decoder modes. The initial window for the modes illustrated in FIGS. 3 to 5 corresponds to the whole address range, for example, 302, 402, 502, and 506, as can be seen in FIG. 3(i), FIG. 4(i), FIG. 5A(i), and FIG. 5B(i), respectively. The computed signature is computed for each of the whole address ranges.

Coming back to FIG. 2, for a particular window and mode, the comparator 210 receives the computed signature from the signature calculation engine 114 and compares it with the golden signature of the window. Depending on the comparison, the comparator 210 generates a signal indicating a mismatch between the computed signature and the corresponding golden signature. The mismatch indicates that the window corresponding to the computed signature is faulty. A faulty window may have faults in one or more cells, rows, columns, or their combination. For explanation purpose, faulty cells 304 and 404, faulty row decoder 504, and faulty column decoder 508 are shown in FIGS. 3 to 5.

Further, the BIST unit 108 is configured to diagnose a location and type of fault in the faulty window. FIG. 3 illustrates, as an example, faulty row window reduction for a stuck-at fault at the faulty cell 304. The faulty row window corresponds to the row fast and the row decrement modes. Among other faults, the row window reduction can locate stuck-at faults and word line coupling faults. The faulty row window in FIG. 3(i) is reduced to two row windows by the window reduction engine 116. Once the reduced windows are created, the signature calculation engine 114 computes the signatures for the two row windows.

Once the signatures are computed, the comparator 210 compares golden signatures for the two row windows and the computed signatures corresponding to the two row windows to determine the faulty row window. In an implementation, the two row windows may be of equal size. For example, if the initial window spanned from first (R1) to the last row (R2) of the address range 302, as illustrated in FIG. 3(i), the two row windows would correspond to (R1 to R3) and to (R3+1 to R2), where R3 is given by:

$$R3 = \left[\frac{R1 + R2}{2}\right] \quad \text{(i)}$$

The row window containing the faulty cell 304 is selected as the next window for further diagnosis, as illustrated in by arrows in FIG. 3(ii). The size of the faulty row window can be further reduced to identify the exact location of the faulty cell 304, as illustrated in FIG. 3(iii) and FIG. 3 (iv).

FIG. 4 illustrates working of the window reduction engine 116 for a faulty column window. The faulty column window reduction targets stuck-at faults as well as bit line coupling faults. The faulty column window corresponds to the column fast and column decrement modes. FIG. 4 (i) illustrates an initial faulty window that corresponds to the whole address range 402.

Similar to the faulty row window reduction, the initial faulty window is reduced to two column windows by the window reduction engine 116. Subsequently, the signature calculation engine 114 computes the signature associated with the two reduced column windows. Further, the comparator 210 compares golden signatures and the computed signatures for the two reduced column windows to determine the faulty column window. In an implementation, the two reduced column windows are of equal size. However, in another implementation, the window sizes can be configured to be of unequal sizes also.

The next faulty column window containing the faulty cell 404 is illustrated by arrows in FIG. 4 (ii). This window can also be further reduced to identify the exact location of the faulty cell 404, as illustrated in FIG. 4(iii) and FIG. (iv) by the corresponding arrows.

FIG. 5A illustrates the working of the window reduction engine 116 for a faulty row decoder window reduction. In this implementation, the faulty row decoder window corresponds to the row decoder mode, and targets delay decoder faults and stuck-at faults. The initial window corresponding to the whole address range 502 is reduced to two row decoder windows by the window reduction engine 116. Subsequently, the signature calculation engine 114 computes signatures associated with the two row decoder windows.

Further, the comparator 210 compares the golden signatures corresponding to the two row decoder windows with the computed signatures for the same row decoder windows to determine the faulty row decoder window. It should be noted that in the row decoder mode, window reduction is such that a cell and its complement cell are placed in the same reduced window. For example, if the initial window spanned from first (R1) to the last row (R2) of the address range 502, as illustrated in FIG. 5A(i), then after reduction, one of the two row decoder windows will correspond to a row decoder window that is a union of rows R1 to R3 and rows R4+1 to R2, while the other row decoder window will correspond to rows R3+1 to R4. In one implementation, the row R3 and R4 can be computed based on the following equations:

$$R3 = \left[\frac{R1 + \left[\frac{R_1 + R_2}{2}\right]}{2}\right] \quad \text{(ii)}$$

and $$R4 = \left[\frac{1 + R2 + \left[\frac{R_1 + R_2}{2}\right]}{2}\right] \quad \text{(iii)}$$

If the row decoder window corresponding to the rows R1 to R3 and rows R4+1 to R2 is faulty, a further window reduction will also be such that a cell and its corresponding complement cell are placed in the same window. Thus, first of the reduced row decoder windows will correspond to rows R1 to R5 and rows R6+1 to R2. The second of the two reduced row decoder windows will correspond to rows R5+1 to R3 and rows R4+1 to R6. In an implementation, the rows R5 and R6 can be computed based on the following equations.

$$R5 = \left[\frac{R1 + R3}{2}\right] \quad \text{(iv)}$$

$$R6 = \left[\frac{R4 + R2}{2}\right] R6 = \left[\frac{R2 + R4 + 1}{2}\right] \quad \text{(v)}$$

FIG. 5B illustrates the working of the window reduction engine 116 for a faulty column decoder window reduction. In this implementation, the faulty column decoder window corresponds to the column decoder mode, and targets delay decoder faults and stuck-at faults. The faulty column decoder window size is reduced in a manner similar to the window reduction for a faulty row decoder window, as illustrated in FIG. 5B(ii). Similar to the row decoder window reduction, the column decoder window reduction can be computed by replacing the rows R1 to R6 by columns C1 to C6.

In an implementation, the window reduction engine 116 reduces the window size for a pre-defined number of iterations. In addition, the window reduction engine 116 reduces the window size for an addressing mode based on the location of faults present in the ROM. For example, if both of the reduced windows have faults present, then the window reduction engine 116 may stop further window reduction.

Referring back to FIG. 2, once the window reduction engine 116 reduces the windows, depending on the mode, the address generator 212 generates the memory addresses corresponding to the reduced faulty windows, namely the reduced row window, the reduced column window, the reduced row decoder window, and the reduced column decoder window. The address generator 212 outputs the addresses to the BIST controller 204. In an implementation, the address generator 212 outputs the addressing mode before providing the address range through the serial interface 206. In an implementation, a two bit addressing mode signal can be used to indicate four different addressing modes. The bitmap engine 214 outputs data corresponding to the address range to the BIST controller 204 through the serial interface 206. The most significant bit (msb) of the data can be outputted before the least significant bit (lsb). In yet another implementation, an intersection of the reduced row decoder window and the reduced column decoder window is first performed and then their address range and data outputted to the BIST controller 204. For such a case, address ranges for three addressing modes, namely the row mode, the column mode, and the decoder mode, are outputted to the BIST controller 204.

The addresses and their corresponding data received by the BIST controller 204 are outputted to the tester 118 for further fault diagnosis and correction. As the BIST unit 108 reduces the amount of data outputted to the tester 118, the speed of testing of SOCs can be drastically increased.

Figure 6:
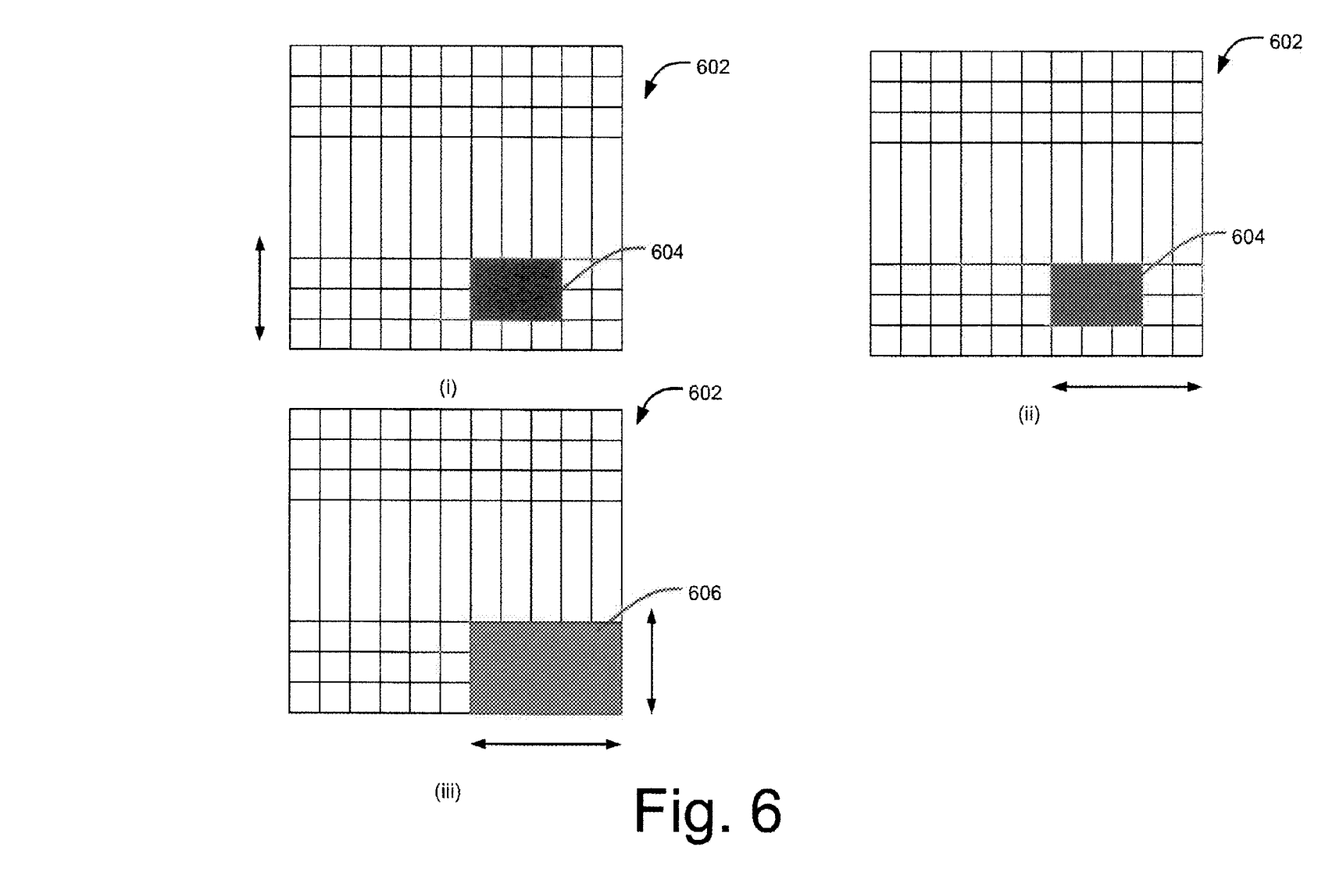
FIG. 6 illustrates a simplified successive reduction diagnosis flow for a faulty window, in accordance with an embodiment of the present subject matter.

In an implementation, the BIST unit 108 can output a common area of the reduced row faulty window and the reduced column faulty window and common area of the reduced faulty row decoder window and the reduced faulty column decoder window. Such a BIST unit 108 can be used to identify stuck-at faults and delay decoder faults. For example, as illustrated in FIG. 6, the whole address range 602 having a clustered fault 604 can be first row reduced and column reduced and then the common area of the row reduced and column window be selected as a reduced row and column faulty window 606. Such an implementation is also referred to as simplified signature based successive reduction (SSSR).

For the SSSR, data corresponding to only two modes, namely a combined row and column mode, and a decoder mode, are outputted by the BIST unit 108. Thus, the BIST unit 108 implementing the SSSR requires a one-bit signal to indicate the data corresponding to these two modes. For example, the one-bit signal is used by the address generator 212 and the bitmap generator 214, output the address range, and the data corresponding to the address range after outputting the one-bit signal, respectively. In an implementation, the address range and the corresponding data is outputted through the serial interface 206.

Figure 7:
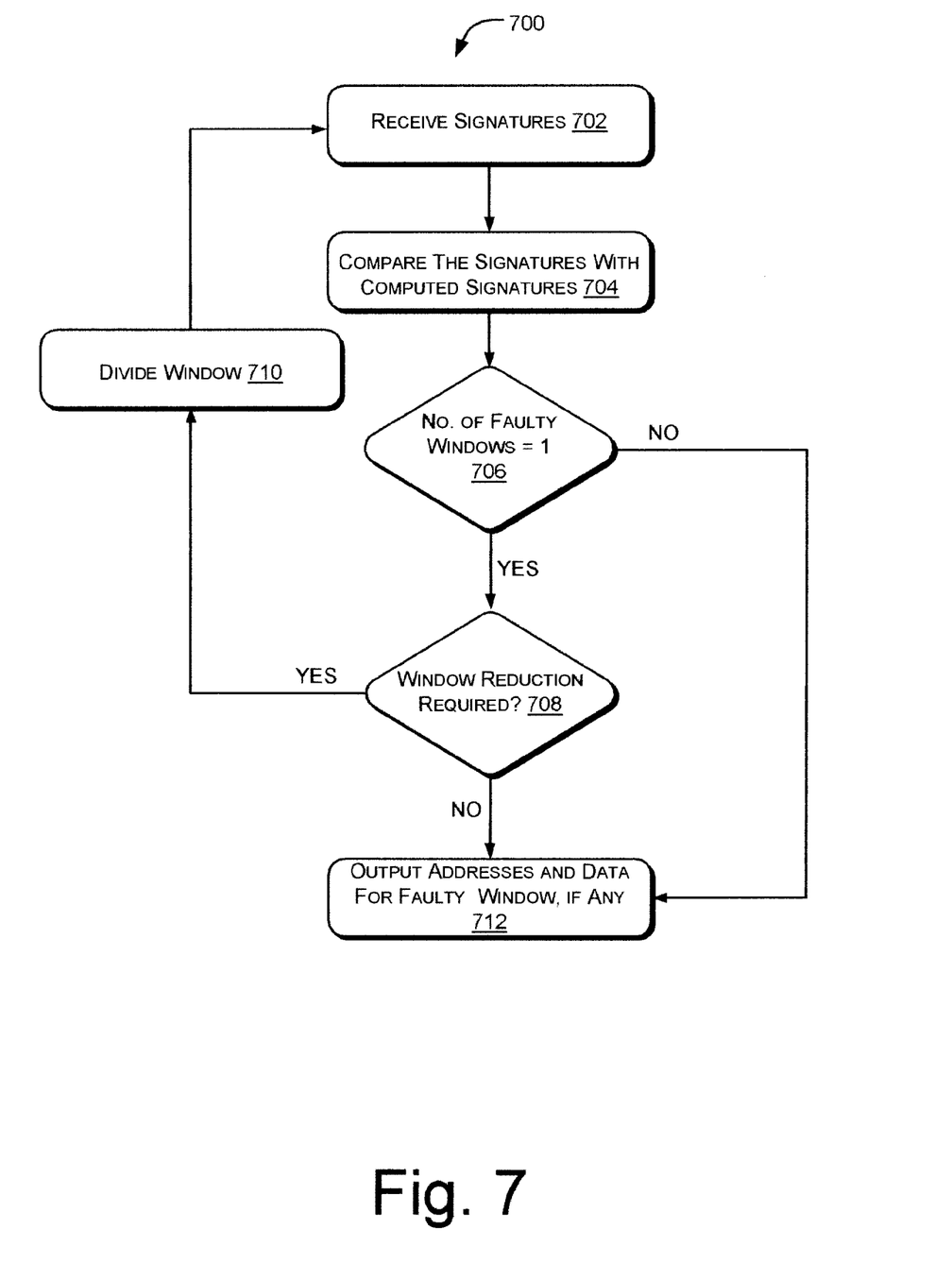
FIG. 7 illustrates an exemplary method for identifying faulty windows in a ROM, in accordance with an embodiment of the present subject matter.

FIG. 7 illustrates an exemplary method 700 for identifying faults in a ROM based on an addressing mode, in accordance with an embodiment of the present subject matter. The exemplary method can be described in the general context of a system on a chip (SOC). The exemplary method 700 is also implementable through computer executable instructions.

The order in which the method is described is not intended to be construed as a limitation, and any number of the described method blocks can be combined in any order to implement the method, or an alternative method. Additionally, individual blocks may be deleted from the method without departing from the spirit and scope of the subject matter described herein. Furthermore, the method can be implemented in any suitable hardware, software, firmware, or combination thereof.

At block 702, a golden signature corresponding to a window is received. In an implementation, for an initial window, say window 302, a controller, such as the BIST controller 204, receives the golden signature from a tester, for example, the tester 118. The window can be initialized so as to include the whole address range of the ROM.

At block 704, the golden signature is compared with a corresponding computed signature. For example, for the initial window 302, the golden signature and the computed signature are compared by the comparator 210. In one implementation, the computed signature is obtained by the signature calculation engine 114, based on contents of the window read from the ROM 110. The contents are read based on an addressing mode, which may include a row addressing mode, a column addressing mode, a row decoder addressing mode, and a column decoder addressing mode.

At block 706, it is determined whether the number of faulty windows present is one. A window is faulty if the golden signature and the corresponding computed signature do not match. For the initial window having a fault, the number of faulty windows is one. If the number of faulty windows is one, the control flows to block 708 ("Yes" branch). Otherwise, the control flows to block 712 ("No" branch). For example, as shown in FIG. 3(i), only one window, i.e., the window 302, is faulty allowing the control to proceed to block 708 ("Yes" branch).

At block 708, it is further determined whether window reduction is required. This determination can be based on a number of criterions. In one implementation, the window reduction can end on completion of a pre-determined number of iterations or can be configured to end when only a single row or column is left in the faulty window. If it is determined that the window reduction is required ("Yes" branch), the control moves to block 710. Otherwise, the process moves to block 712 ("No" branch).

At block 710, the size of the faulty window is reduced by dividing the faulty window into at least two reduced windows. The size reduction can be based on any one of the addressing modes. In one implementation, the window reduction engine 116 reduces the window corresponding to the whole address range 302 and 402 based on the row addressing mode and column addressing mode, respectively, as described in FIGS. 3 and 4. In another implementation, the window reduction engine 116, for row decoder and column decoder mode, reduces the row decoder window size and the column decoder window size, as described in FIG. 5A and FIG. 5B, respectively.

After reducing the size of the window, the steps of the blocks 702, 704, and 706 are performed again. At block 706, it is again determined whether the number of faulty windows present is one or not.

If at block 706, it is determined that the number of the faulty windows present is not one, i.e., there are no faults or more than one fault ("No" branch), and upon determining at block 708 that the window reduction is not required ("No" branch), the control moves to block 712.

At block 712, an address range and data corresponding to that address range of the faulty window are outputted or shifted out. For example, for the row addressing mode, the faulty windows outputted target to stuck-at faults and word line coupling faults, as illustrated in FIG. 3. For the column addressing mode, the faulty windows outputted target to stuck-at faults and bit line coupling faults, as illustrated in FIG. 4. For the row decoder mode and the column decoder mode, the faulty windows outputted target at stuck-at faults and delay decoder faults, as illustrated in FIG. 5. In one implementation, the address range of the faulty window is provided by the address generator 212, and the data corresponding to the address range is provided by the bitmap generator 214. If the number of faulty windows is more than one, then the address range and the data corresponding to the faulty window before being divided at block 710 is outputted at block 712.

Figure 8A:
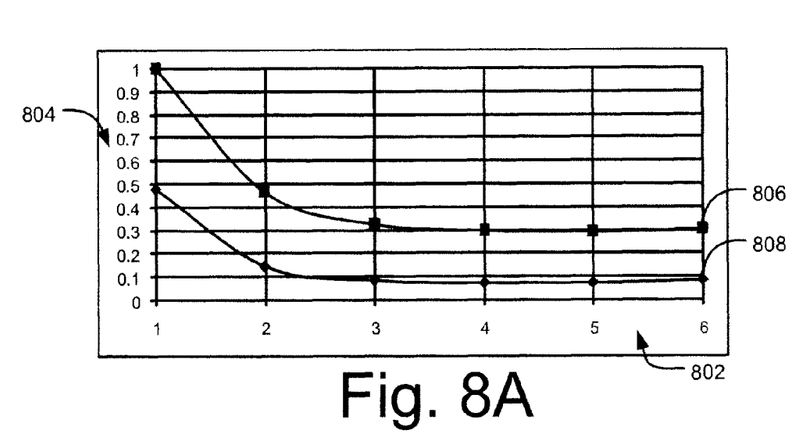
FIG. 8 illustrates graphs representing tester time spent versus number of iterations and tester memory consumption versus number of iterations for a signature-based successive reduction (SSR) method and a simplified signature-based successive reduction (SSSR) method, in accordance with an embodiment of the present subject matter.
Figure 8B:
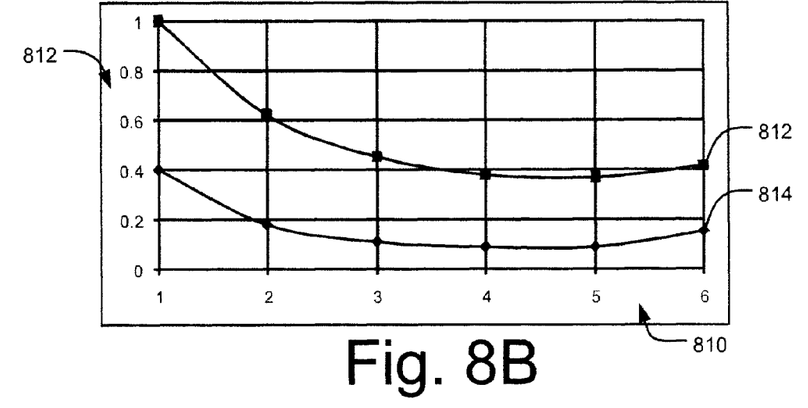

FIGS. 8A and 8B illustrate a comparison of, for a specific test case, the efficiency of two implementation, namely the SSR and the SSSR, in accordance with the present subject matter when compared to the conventional method. FIG. 8A illustrates the time taken by the tester 118 when following the two methods with respect to the number of iterations (n) of window reduction. The number of iterations is represented by axis 802, while the time taken in each iteration is represented by axis 804. The SSR method is illustrated by curve 806 while the SSSR method is illustrated by curve 808. As can be seen, the time taken by the tester 118 first decreases, with the increasing number of iterations, and then starts to increase with further increase in the number of iterations. For the present test case, the time taken by the conventional method and the method in accordance with the present subject matter is normalized to 1.

FIG. 8B illustrates memory consumption of the tester 118 when following the SSR and the SSSR methods with respect to the number of iterations. The number of iterations of window reduction is represented by axis 810 while the memory consumption of the tester 118 is represented by axis 812. The SSR method is illustrated by curve 814 while the SSSR method is illustrated by curve 816. In the conventional method, the memory consumption corresponds to one iteration of the SSR method. As for the time taken by the tester 118, the memory consumption of the tester 118 also first decreases with the number of iterations and then starts to increase, as illustrated in FIG. 8B. As can be seen from the graphs, the optimum number of iterations of window reduction is about 5 iterations for taken fault scenarios in consideration.

The graphs of FIG. 8 have been obtained by simulating different types of faults in a ROM, for example a single stuck-at fault, a cluster of cells having faults, scattered stuck-at faults, a single row fault, a single column fault, a partial row fault and a partial column fault. For the present test case, the probability of fault occurrence in the simulated fault types is assumed to be equal. It should be noted that the simulated fault types are only indicative and the subject matter should not be limited to simulated cases as illustrated. For the present case, the ROM size used for testing is 512×8 m16. Also speed of the tester 118 is assumed to be about one-tenth of the speed of the ROM. On an average, over the various fault types, the reduction in time and memory consumption of the tester 118 is up to about 75% for the SSR method and up to about 90% for the SSSR method.

Although embodiments for diagnosis flow of a ROM have been described in language specific to structural features and/or methods, it is to be understood that the invention is not necessarily limited to the specific features or methods described. Rather, the specific features and methods are disclosed as exemplary embodiments for the diagnosis flow of the ROM.

I claim:

1. A system-on-a-chip (SOC) comprising:
a memory; and
a Built-in Self Test (BIST) unit coupled to the memory, the BIST unit configured to
compute a signature based on contents from a window of the memory,
receive a pre-computed signature associated with the contents from the window of the memory,
compare the computed signature with the pre-computed signature, and
determine whether a window reduction is required for the window of the memory, and if so,
reduce the window of the memory into a plurality of reduced windows to identify at least one fault present in the memory based on the results of the comparison of the pre-computed signature and the computed signature,
generate a plurality of reduced computed signatures from contents in the plurality of reduced windows of the memory, and
compare a plurality of reduced pre-computed signatures with the plurality of reduced computed signatures.

2. The SOC as claimed in claim 1, wherein the BIST unit is configured to receive the pre-computed signature associated with the contents from the window of the memory from a tester external to the SOC.

3. The SOC as claimed in claim 1, wherein the BIST unit is configured to compute the computed signature based on an addressing mode.

4. The SOC as claimed in claim 1, wherein the BIST unit is configured to successively reduce a size of the window having faults into at least two reduced windows.

5. The SOC as claimed in claim 1, wherein the BIST unit is configured to generate addresses corresponding to the at least one fault identified.

6. The SOC as claimed in claim 5, wherein the BIST unit is configured to output the addresses generated based on one or more addressing modes selected from a row mode, a column mode, a row decoder mode, and a column decoder mode.

7. The SOC as claimed in claim 5, wherein the BIST unit is configured to output an intersection of address ranges, which are generated based on a row decoder mode and a column decoder mode.

8. The SOC as claimed in claim 5, wherein the BIST unit is configured to output an intersection of the address ranges, which are generated based on a row mode and a column mode.

9. The SOC as claimed in claim 1, wherein the BIST unit is configured to output contents of the memory to a tester.

10. The SOC as claimed in claim 9, wherein the BIST unit is configured to output the contents based on one or more addressing modes selected from a row mode, a column mode, a row decoder mode, and a column decoder mode.

11. The SOC as claimed in claim 9, wherein the BIST unit is configured to output the contents corresponding to an intersection of address ranges generated based on a row decoder mode and a column decoder mode.

12. The SOC as claimed in claim 9, wherein the BIST unit is configured to output the contents corresponding to an intersection of address ranges generated based on a row mode and a column mode.

13. A memory circuit comprising:
a memory; and
a processing unit coupled to the memory, the processing unit configured to
compute a signature based on contents from a window of the memory, receive a pre-computed signature associated with the contents from the window of the memory,
compare the computed signature with the pre-computed signature, and
determine whether a window reduction is required for the window of the memory, and if so,
reduce the window of the memory into a plurality of reduced windows to identify at least one fault present in the memory based on the results of the comparison of the pre-computed signature and the computed signature,
generate a plurality of reduced computed signatures from contents in the plurality of reduced windows of the memory, and
compare a plurality of reduced pre-computed signatures with the plurality of reduced computed signatures.

14. The memory circuit as claimed in claim 13, wherein the processing unit is configured to receive the pre-computed signature associated with the contents from the window of the memory from a tester external to the SOC.

15. The memory circuit as claimed in claim 13, wherein the processing unit is configured to compute the computed signature based on an addressing mode.

16. The memory circuit as claimed in claim 13, wherein the processing unit is configured to successively reduce a size of the window having faults into at least two reduced windows.

17. The memory circuit as claimed in claim 13, wherein the processing unit is configured to generate addresses corresponding to the at least one fault identified.

18. A method for identifying faults in a memory circuit comprising a memory, and a processing unit coupled to the memory, the method comprising:
operating the processing unit to
compute a signature based on contents from a window of the memory, receive a pre-computed signature associated with the contents from the window of the memory,
compare the computed signature with the pre-computed signature, and
determine whether a window reduction is required for the window of the memory, and if so,
reduce the window of the memory into a plurality of reduced windows to identify at least one fault present in the memory based on the results of the comparison of the pre-computed signature and the computed signature, generate a plurality of reduced computed signatures from contents in the plurality of reduced windows of the memory, and compare a plurality of reduced pre-computed signatures with the plurality of reduced computed signatures.

19. The method as claimed in claim 18, further comprising operating the processing unit to receive the pre-computed signature associated with the contents from the window of the memory from a tester external to the SOC.

20. The method as claimed in claim 18, further comprising operating the processing unit to compute the computed signature based on an addressing mode.

21. The method as claimed in claim 18, further comprising operating the processing unit to successively reduce a size of the window having faults into at least two reduced windows.

22. The method as claimed in claim 18, further comprising operating the processing unit to generate addresses corresponding to the at least one fault identified.

* * * * *